United States Patent

Longeway et al.

[11] Patent Number: 4,597,004
[45] Date of Patent: Jun. 24, 1986

[54] PHOTODETECTOR

[75] Inventors: Paul A. Longeway, East Windsor; Michael Ettenberg, Freehold, both of N.J.

[73] Assignee: RCA Corporation, Princeton, N.J.

[21] Appl. No.: 707,795

[22] Filed: Mar. 4, 1985

[51] Int. Cl.$^4$ .................... H01L 27/14; H01L 31/00
[52] U.S. Cl. ........................ 357/30; 357/13; 357/16; 357/58; 357/90
[58] Field of Search ............ 357/30, 13, 16, 61, 357/58, 90

[56] References Cited

U.S. PATENT DOCUMENTS

| | | | |
|---|---|---|---|
| 4,383,269 | 5/1983 | Capasso | 357/16 |
| 4,473,835 | 9/1984 | Forrest et al. | 357/30 |
| 4,553,155 | 11/1985 | Chen et al. | 357/30 |

OTHER PUBLICATIONS

P. P. Webb et al., IEEE Transactions on Electron Devices, vol. ED-30, No. 4., Apr. 1983, pp. 395–400.
G. H. Olsen in *GaInAsP Alloy Semiconductors*, T. P. Pearsall, ed., John Wiley & Sons (New York 1982) pp. 11–41.

*Primary Examiner*—James W. Davie
*Assistant Examiner*—Georgia Y. Epps
*Attorney, Agent, or Firm*—Birgit E. Morris; Donald S. Cohen; William J. Burke

[57] ABSTRACT

A photodetector includes a cap layer over an absorptive layer with the P-N junction formed in the absorptive layer by diffusion of conductivity modifiers from the cap layer. If this diffusion extends too far into the absorptive layer, the detector is rendered useless. The invention includes a photodetector with a buffer layer between the absorptive and cap layers. The concentration of conductivity modifiers is substantially constant in the cap layer, decreases with distance in the buffer layer from the cap layer and extends into the absorptive layer. The invention also includes a method of making this device which includes the steps of forming a buffer layer over the absorptive layer, forming a cap layer over the buffer layer and diffusing the opposite type conductivity modifiers from the cap layer into the buffer and absorptive layers.

4 Claims, 3 Drawing Figures

PHOTODETECTOR

The invention relates to a photodetector having improved manufacturability and a method of making this device.

BACKGROUND OF THE INVENTION

In semiconductor devices the precise location of the P-N junction, for example its location relative to a particular interface within the device, is often critical to the device performance. The location of the junction may vary from one batch of devices to another because of fluctuations in, or inadequate control of, the conductivity modifier concentration, the diffusion time or temperature, and subsequent processing steps. These variations can result in a low yield of useful devices at the end of the manufacturing process.

A particular example of this problem arises in the manufacture of a P-I-N photodetector such as that described by Webb et al. in the IEEE Transactions on Electron Devices ED-30, 395(1983). This photodetector includes an N-type InP substrate, an $In_{0.53}Ga_{0.47}As$ absorptive layer on the substrate and a P-type InP cap layer on the absorptive layer. The as-deposited absorptive layer is undoped and generally contains a low number of N-type conductivity modifiers. The P-N junction is formed in the absorptive layer, preferably a small distance from the interface between the absorptive and cap layers, by diffusion of P-type conductivity modifiers from the cap layer into the absorptive layer during the deposition of the cap layer. Variations in the growth procedure, for example too large a concentration of P-type conductivity modifiers in the cap layer will convert a large portion of the absorptive layer to P-type conductivity. It is also useful to provide a comparatively thick cap layer over the absorptive layer to increase the resistance of the detector to mechanical damage during wire bonding. However, during the prolonged high temperature deposition of the cap layer the conductivity modifiers can diffuse through most or all of the absorptive layer.

The effect of this larger than desired P-type region is that a large fraction of the light passing through the transparent cap layer is then absorbed in the P-type region of the absorptive layer. The electron-hole pairs so-generated recombine in the P-type portion before the electrons and holes can be separated and detected, thereby rendering the device useless.

It would be desirable to have a detector structure and method of fabrication which reduces or eliminates this problem and which provides improved control during manufacture of the location of the P-N junction.

SUMMARY OF THE INVENTION

The invention is a photodetector comprising a first layer, and absorptive layer, a buffer layer, and a cap layer with the absorptive, buffer, and cap layers sequentially overlying the first layer. The first layer is of one conductivity type and the buffer and cap layers as well as a portion of the absorptive layer adjacent to the buffer layer are of the opposite conductivity type. The concentration of electrically active opposite type conductivity modifiers is substantially constant in the cap layer and decreases with distance from the cap layer towards the absorptive layer in the buffer layer.

The invention is also a method of fabricating this photodetector comprising forming a substantially intrinsic conductivity type absorptive layer on a first layer of first conductivity type, forming a substantially intrinsic conductivity type buffer layer over the absorptive layer and forming a cap layer of opposite conductivity type over the buffer layer. The opposite type conductivity modifiers diffuse through the buffer layer and into the absorptive layer to form the P-N junction therein.

DETAILED DESCRIPTION OF PREFERRED EMBODIMENTS

We have found that a large excess concentration of zinc may be present in an as-deposited zinc-doped InP cap layer. This excess concentration of zinc, which we believe to be located in interstitial lattice sites, is not electrically active and is thus not detected by electrical measurements on the as-deposited combination of layers. This excess concentration, however, is a high density source for the diffusion of zinc into the underlying layers where it becomes electrically active by substitutionally occupying Group III metal sites. The use of a buffer layer between the zinc-doped cap layer and the absorptive layer of a photodetector provides a region which can accomodate this excess zinc thereby limiting the amount which will diffuse into the underlying absorptive layer.

Figure 1:
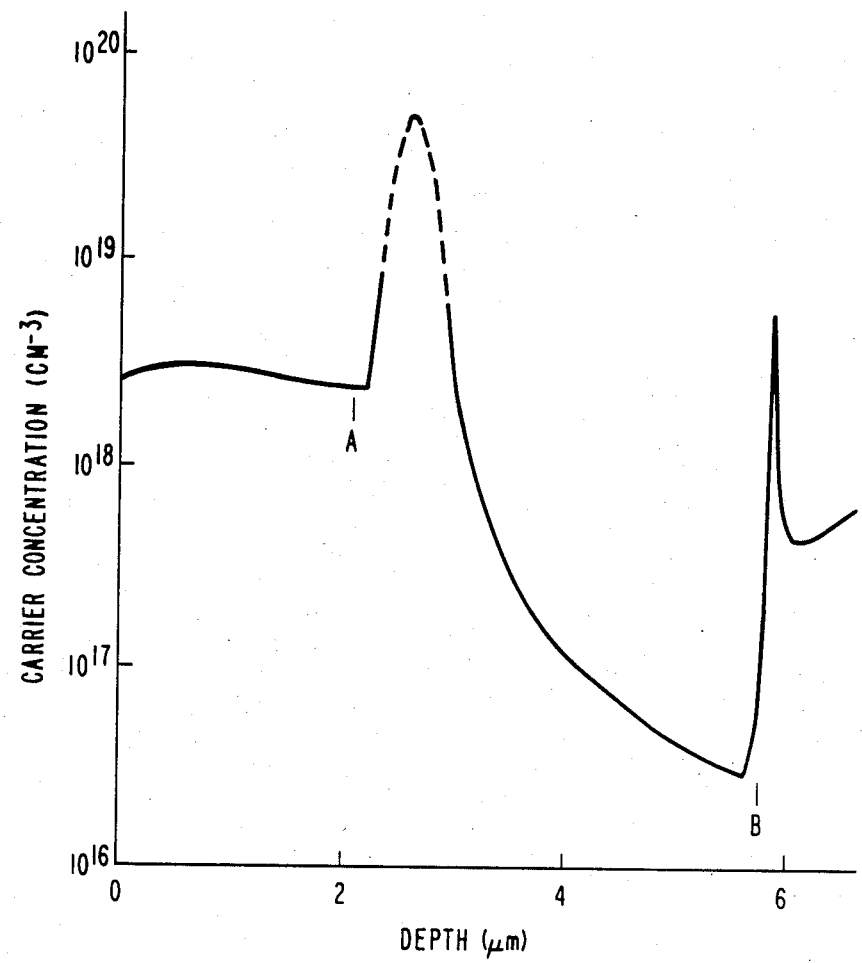
FIG. 1 is a graphical illustration of the variation in the carrier concentration with position in a prior art photodetector.

This problem is illustrated in FIG. 1 where the carrier concentration is plotted as a function of depth into a photodetector, such as that described by Webb et al., from the surface of the cap layer with the magnitude of the carrier concentration corresponding to the electrically active zinc concentration. The carrier concentration was measured on a sample immersed in an electrochemical cell using a Post Office Profile Plotter manufactured by Biorad, Inc., Cambridge, MA. The absolute value of the carrier concentration is believed to be accurate only to within a factor of about 10. Zero depth is at the cap layer surface. Point A on the curve is the heterojunction interface between the cap and absorptive layers and the point B is the P-N junction. The location of the P-N junction is determined in a companion measurement by the change in the phase difference between the applied and measured voltages across the electro-chemical cell.

The zinc concentration is substantially constant through the cap layer to the interface at A, increases rapidly to a peak whose magnitude is estimated for concentrations greater than $5 \times 10^{18}/cm^3$ as shown by the dotted line and then decreases over a distance of about 4 μm to the P-N junction at B in the absorptive layer. The concentration peak in the absorptive layer near the interface with the cap layer is caused by the greater solubility of substitutional zinc in InGaAs as compared to InP. The peak in the concentration beyond the P-N junction is an artifact of the measuring instrument which occurs when the conductivity type of the material changes. The combination of the substantially constant electrically active zinc concentration in the cap layer and the peak in the zinc concentration in the absorptive layer at the heterojunction indicates that there is a large concentration of non-electrically active zinc in the cap layer. This FIGURE clearly show the extent to which the zinc can diffuse a large distance into the undoped absorptive layer during the deposition of a contiguous cap layer.

Figure 2:
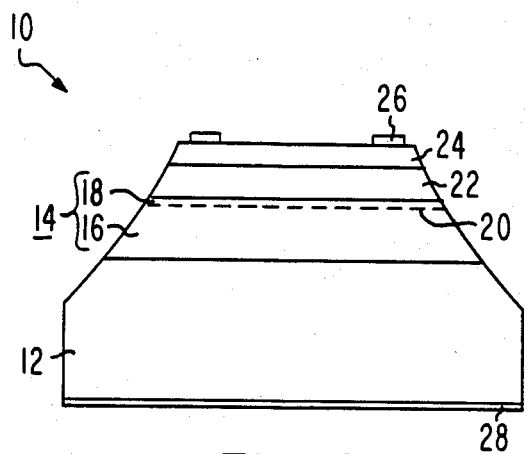
FIG. 2 is a cross-sectional view of a photodetector of the invention.

In FIG. 2 a photodetector 10 includes a first layer 12 having first conductivity type, an absorptive layer 14 overlying a surface of the first layer 12 and having a first region 16 of substantially intrinsic conductivity type adjacent to the first layer 12 and a second region 18 having the opposite conductivity type to that of the first layer 12. Substantially intrinsic conductivity type in the absorptive layer 14 is meant to include a slight excess of P or N-type conductivity modifiers in a concentration less than about $5 \times 10^{15}/cm^3$ and preferably less than about $10^{15}/cm^3$. A semiconductor junction 20 is formed at the interface between the first and second regions 16 and 18, respectively. A buffer layer 22 overlies the absorptive layer 14 adjacent to the second region 18 and a cap layer 24 overlies the buffer layer 22. The buffer and cap layers 22 and 24, respectively, have the same conductivity type as that of the second region 18 and the opposite conductivity type to that of the first layer 12. The conductivity types of the different layers and regions may be reversed so long as the relative conductivity types are maintained. A first electrode 26 overlies the cap layer 24 and a second electrode 28 contacts the first layer 12.

The layers may be deposited using well-known liquid phase or, preferably, vapor phase epitaxial techniques such as those disclosed by G. H. Olsen in *GaInAsP Alloy Semiconductors*, T. P. Pearsall, editor, John Wiley & Sons (New York 1982). The residual concentration of conductivity modifiers in the first region 16 is preferably kept as low as possible by removing any potential sources of contamination from the vapor stream and the reaction chamber.

The first layer 12 typically functions as the substrate which supports the remainder of the device structure and is typically composed of N-type InP. The surface upon which the remaining layers are deposited is preferably oriented about 2.0 degrees off of the (100) crystallographic plane. This surface is treated with degreasing and etching chemicals, as described by Olsen, prior to the deposition of the layers thereon.

The absorptive layer 14 is typically between about 6 and 8 micrometers ($\mu$m) thick and is composed of an alloy which is absorptive of light at the particular wavelength to be detected. This layer may have a constant or graded bandgap and may include a thin layer of a material having a bandgap intermediate to those of the absorptive and buffer layers 14 and 22, respectively, to reduce charge pileup at the heterojunction. For the wavelength range between 1.2 an 1.7 $\mu$m $In_{0.53}Ga_{0.47}As$ is a suitable material. This layer, as deposited, is preferably undoped and has substantially intrinsic conductivity type as described above. The second region 18 typically has P-type conductivity and contains about $1 \times 10^{17}$ acceptors/cm$^3$, typically zinc. The buffer layer 22, as deposited, is typically between 1 and 2 $\mu$m thick and is composed of substantially intrinsic conductivity type InP which includes a slight excess of P or N-type conductivity modifiers. The buffer layer 22 is not intentionally doped when deposited on the absorptive layer 14 and typically has N-type conductivity with a carrier concentration of about $10^{16}/cm^3$ or less. The buffer layer 22 is converted to the same conductivity type as the cap layer 24 by diffusion of conductivity modifiers therefrom. The cap layer 24 is typically between 2 and 3 $\mu$m thick and is composed of InP doped with a P-type conductivity modifier during the deposition process by adding the conductivity modifier, typically zinc in $H_2$, to the vapor stream. Preferably the thickness of the buffer layer 22 is less than that of the cap layer 24. Typically the first, buffer and cap layers 12, 22 and 24, respectively, are light-transmissive and preferably substantially transparent at the wavelength to be detected. During the deposition process the deposited layers are held at a temperature between about 670° C. and 700° C. The conductivity modifiers diffuse at this temperature from the cap layer 24 through the buffer layer 22 and into the undoped absorptive layer 14 to form the second P-type conductivity region 18.

The first and second electrodes 26 and 28, respectively, are means for providing electrical contact to the photodetector. The first electrode 26 may be composed of a gold-zinc alloy if the cap layer 24 is P-type and the second electrode 28 may be composed of a gold-tin alloy if the first layer 12 is N-type. Both electrodes may be deposited by vacuum evaporation.

Other combinations of Group III and V elements may be used in the layers depending upon the detector requirements. Preferably the lattice constants of the layers are matched to one another as closely as possible.

Figure 3:
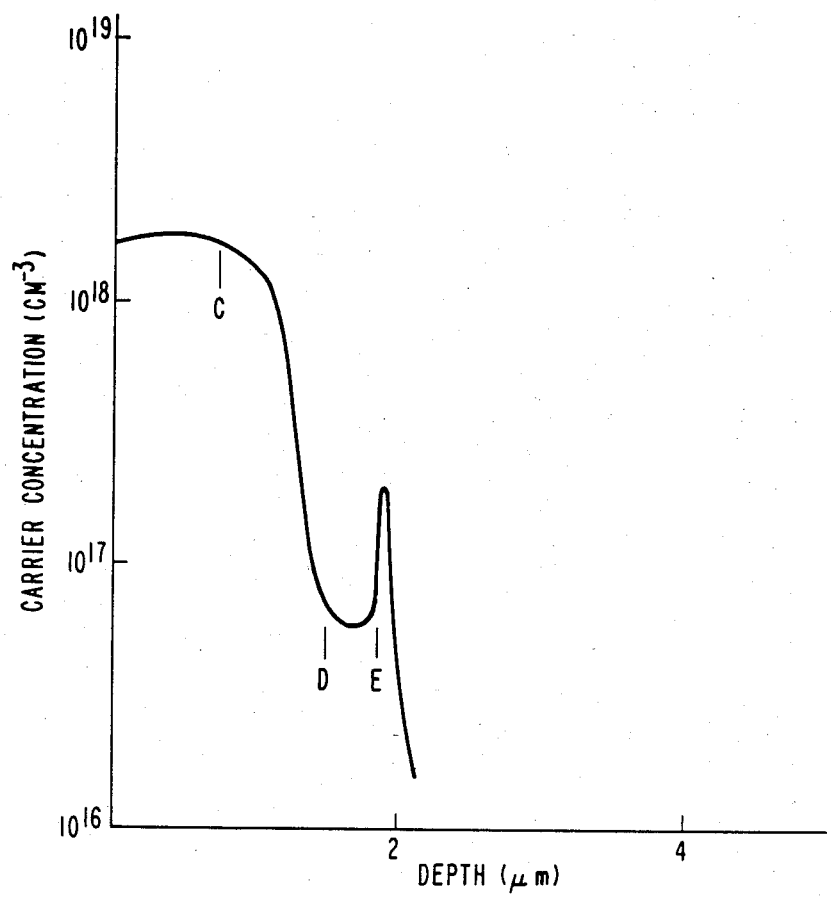
FIG. 3 is a graphical illustration of the variation in the carrier concentration with position in a photodetector of the invention.

In FIG. 3 the free carrier concentration is plotted as a function of the depth from the surface of the cap layer into a photodetector incorporating the buffer layer of the invention. Zero depth is again at the cap-layer surface. The point C marks the cap-buffer layer interface, the point D marks the buffer-absorptive layer heterojunction interface, and the point E marks the P-N junction. The zinc concentration is substantially constant in the cap layer, decreases with distance into the buffer layer 22 from the cap layer 24 and extends a distance of about 0.4 $\mu$m into the absorptive layer 14.

The method of the invention comprises the steps of forming a substantially intrinsic conductivity type aborptive layer on a surface of a first layer which has first conductivity type, forming a buffer layer over the absorptive layer, and forming a cap layer of second conductivity type opposite to the conductivity type of the first layer over the buffer layer. The as-deposited buffer layer, preferably has substantially intrinsic conductivity type which includes an excess carrier concentration of about $10^{16}/cm^3$ of less. The opposite type conductivity modifiers are diffused from the cap layer into the buffer layer during the subsequent deposition of the cap layer.

We claim:

1. A photodetector for light of a particular wavelength comprising:
    a first layer of first conductivity type;
    an absorptive layer which is composed of a material which absorbs light at said wavelength and which includes a first region having substantially intrinsic conductivity type adjacent to the first layer and a second region having the opposite conductivity type to that of the first layer;
    a buffer layer adjacent to the second region;
    a cap layer overlying the buffer layer; and
    means for providing electrical contact to the cap and first layers;
    the buffer and cap layers having the opposite conductivity type to that of the first layer with the cap layer having a substantially constant concentration of opposite type conductivity modifiers and the buffer layer having a decreasing concentration gradient of opposite type conductivity modifiers from the cap layer to the absorptive layer.

2. The photodetector of claim 1 wherein the thickness of the buffer layer is less than that of the cap layer.

3. The photodetector of claim 2 wherein the first layer is N-type InP, the absorptive layer is an InGaAs alloy, and the buffer and cap layers are P-type InP.

4. The photodetector of claim 3 wherein the first layer is a substrate which supports the remainder of the photodetector.

* * * * *